United States Patent [19]
Bielig et al.

[11] Patent Number: 5,587,865
[45] Date of Patent: Dec. 24, 1996

[54] ELECTRONIC CONTROL EQUIPMENT FOR MOTOR VEHICLES, PARTICULARLY, ELECTRONIC BRAKE CONTROL EQUIPMENT

[75] Inventors: Peter M. Bielig; Klaus Brähler, both of München; Günther Gschoßmann, Mühldorf, all of Germany

[73] Assignee: Knorr-Bremse Systeme Fur Nutzfahrzeuge GmbH, Munich, Germany

[21] Appl. No.: 432,088

[22] Filed: May 1, 1995

[30] Foreign Application Priority Data

May 2, 1994 [DE] Germany ............... 44 15 386.4

[51] Int. Cl.$^6$ ............................................. H02H 3/16
[52] U.S. Cl. ............................ 361/45; 361/49; 361/91; 307/10.1
[58] Field of Search ................... 361/42–50, 91, 361/187; 307/130, 662, 10.1; 340/644–653

[56] References Cited

U.S. PATENT DOCUMENTS

| | | | |
|---|---|---|---|
| 4,709,164 | 11/1987 | Giesl | 307/326 |
| 4,994,933 | 2/1991 | Matsuoka | 361/42 |
| 5,166,852 | 11/1992 | Sano | 361/42 |
| 5,205,619 | 4/1993 | Holst et al. | 303/92 |

FOREIGN PATENT DOCUMENTS

| | | | |
|---|---|---|---|
| 0025913 | 1/1981 | European Pat. Off. | B60T 17/22 |
| 0415039 | 6/1991 | European Pat. Off. | B60T 8/88 |
| 0426103 | 8/1991 | European Pat. Off. | H02H 5/10 |
| 3429067 | 2/1986 | Germany | H02H 5/10 |
| 3920805 | 1/1991 | Germany | G05F 1/573 |
| 4209474 | 9/1993 | Germany | H02J 13/00 |
| 4210797 | 10/1993 | Germany | G01R 31/02 |

*Primary Examiner*—Jeffrey A. Gaffin
*Assistant Examiner*—Michael Sherry
*Attorney, Agent, or Firm*—Senniger, Powers, Leavitt & Roedel

[57] ABSTRACT

Electronic control apparatus for motor vehicles. The apparatus includes a test circuit which causes a test current to flow through a load being operated by the apparatus and which detects the magnitude of the test current. From the magnitude of the test current, an evaluation circuit determines whether the ground potential of the control apparatus and the ground potential of the load are at different levels. In response to a potential difference between the two ground potentials, the evaluation circuit initiates countermeasures for preventing damage to the electronic control apparatus, such as selectively disconnecting the load with a power switch responsive to the evaluation circuit.

12 Claims, 3 Drawing Sheets

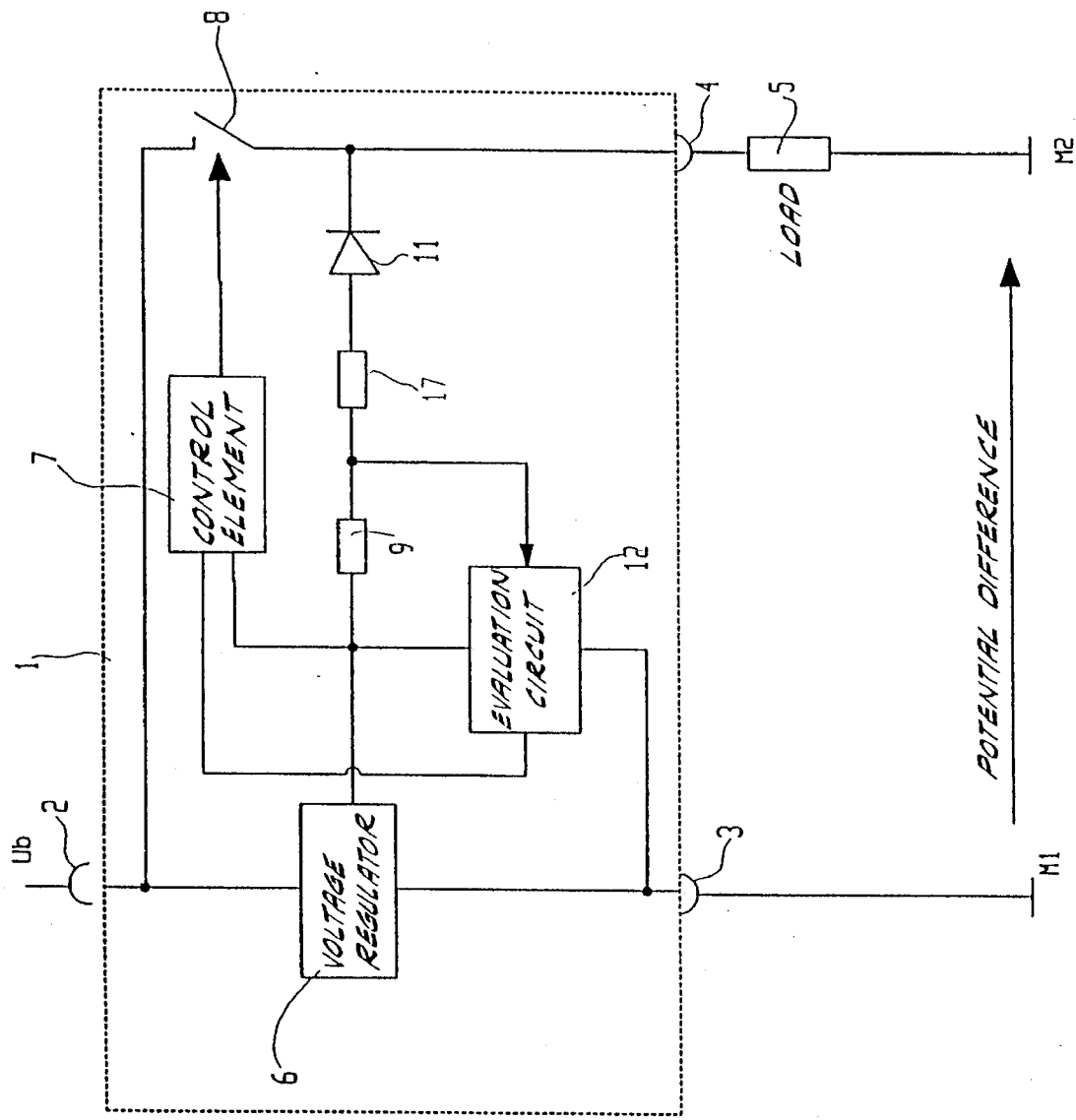

ELECTRONIC CONTROL EQUIPMENT FOR MOTOR VEHICLES, PARTICULARLY, ELECTRONIC BRAKE CONTROL EQUIPMENT

BACKGROUND OF THE INVENTION

The invention pertains to electronic control equipment for motor vehicles and, particularly, to electronic brake control equipment for motor vehicles.

In motor vehicle wiring, undesirable potential differences often occur, due to contact resistances, especially on ground paths. This means that different types of electrical equipment present in the motor vehicle have different voltage levels with respect to ground potential. For instance, brake control equipment, such as electronic antilocking equipment or the like, can have a considerably higher ground potential than loads driven by it, such as magnetic valves, which are at ground potential on one side. This may lead to malfunctions of or damage to electronic components of the control equipment since they are being operated outside their specifications.

If the ground potential of the load is higher than the ground potential of the control equipment, the load has a higher resistance from the perspective of the control equipment, which is of no further concern for the functioning of the control equipment. In the worst case, the load will no longer work properly; for instance, a solenoid will not activate, despite applied exciter potential. In contrast, if the ground potential of the load is lower than the ground potential of the control equipment, then the ground potential of the load will appear as a negative potential from the potential of the control equipment. This can lead to overloads on the control equipment and to the destruction of some components in it.

To solve this problem it has thus far only been possible to pull a special ground line through the vehicle, which represents a considerably increased expense in wiring, but does not exclude the possibility of potential differences because of contact resistance at plug connections.

German patent reference DE 42 10797 discloses a circuit for monitoring an electric line for short circuits or broken lines. As shown in the reference, a speed circuit, which is connected between positive supply voltage and ground potential, provides electrical pulses representing the speed of a vehicle. When a first transistor is switched on, the potential of one connector will be the ground potential; when the first transistor is switched off, this potential will be the positive supply voltage level. This known circuit has two test circuits. The first test circuit, which includes a first resistor, is always active and checks for a broken line. In this case, a second resistor is no longer connected with the input of a trigger circuit and, therefore, the first resistor always connects the positive supply voltage to the input of the trigger circuit. In this state, the trigger circuit and associated microprocessor do not receive pulses but only a constant voltage which is recognized by the microprocessor. However, in this case a test current does not flow through the speed circuit.

A second test circuit disclosed by the German patent reference DE 42 10797 includes the trigger circuit and microprocessor. This second test circuit is active when the pulse-like signals from the speed circuit have a very low frequency. When the microprocessor detects this state, it gives a pulse on its output to the second test circuit. A pair of transistors as well as a diode are switched on and, via a third resistor, an electrical pulse is fed to the input of the trigger circuit. If the speed circuit or line do not have a short circuit, this pulse switches the trigger circuit on, which is detected by the microprocessor. In case of a short circuit of the line, the test pulse is suppressed and the trigger circuit does not switch. This is detected by the microprocessor as a fault. In this case, a test current pulse is used but the magnitude of this current is not measured. The second test circuit only checks whether the voltage on the input to the trigger circuit has a threshold value for switching the trigger circuit.

Thus, it is not possible to detect a difference between the ground potential of a load and the ground potential of a control apparatus with the circuit disclosed in DE 42 10797. Even if the ground potential of the speed circuit at the emitter of the first transistor is different with respect to the ground potential of the control apparatus, the difference cannot be detected by the test current pulse because this test current pulse is produced just at a time when the first transistor is switched off. When the first transistor is switched off, the ground potential on its emitter has no influence on the ground potential of its collector. Therefore, the trigger circuit would detect a correct test pulse and the circuit would not detect an error.

Therefore, a control device is needed which advantageously causes a test current to flow through a load in response to a ground potential difference, measures the magnitude of the test current and initiates countermeasures to protect the control device from damage resulting from differences in the ground potentials. Further, a control device is needed which produces the test current only when a difference in the ground potentials occurs. This is particularly beneficial because in monitoring an electronic circuit, monitoring circuitry generally must be active in order to detect an error.

SUMMARY OF THE INVENTION

The objective of the invention is to put electronic control equipment in position, with a simple and economical circuit arrangement to recognize the above-described potential difference between the ground potential of the control equipment and the ground potential of a load with the positive supply voltages, usually the only ones available in motor vehicle control equipment, and then to make it possible to take appropriate measures to protect endangered components.

This problem is solved with the characteristics listed specified in the claims. Advantageous configurations and refinements of the invention are to be found in the subordinate claims.

The fundamental principle of the solution consists in causing a test current to flow through the load and to take countermeasures if this test current lies outside preset limit values. These countermeasures can consist in turning off a power switch with which the load is supplied with electric energy when there is a danger to components in the control equipment due to excessively high ground potential differences. In many cases, the load driven by the control equipment is a solenoid that is driven by voltage pulses, which is why the control equipment used for them uses a power switch, which may, for instance, be a transistor. These power switches are sensitive to excessively high current loads, which is why it is practical, according to a refinement of the invention, to separate power switches from the evaluation circuitry if countermeasures are to be taken.

According to a preferred refinement of the invention, it is provided that the circuit arrangement allows the test current to flow at a prescribed minimum magnitude only if the ground potential of the control equipment is greater than the ground potential of the load by a prescribed value. Thus, the test current does not flow constantly, but only after a prescribed minimum potential difference has been reached. The circuit arrangement responsible for the test current is self-activated, as it were, when this potential difference is reached. According to one claimed embodiment, this is achieved essentially by a Zener diode. According to another claimed embodiment, this is done by an optocoupler, the switching transistor of which becomes conductive only if the current flowing through the light-emitting diode has reached a prescribed response threshold for the switching transistor. Alternatively, this characteristic is achieved by the diode, which likewise becomes conductive only after reaching a threshold voltage.

Briefly, therefore, the invention is directed to an electronic control apparatus that controls an electrical load for use in motor vehicles. The device has at least one supply voltage terminal for providing a supply voltage to the control apparatus, at least one ground terminal for grounding the control apparatus at a ground potential M1, and at least one output terminal for driving the load with the supply voltage, the load having a first connection to the output terminal and a second connection grounded to a ground potential M2. The device further has a test circuit for causing a test current having a predetermined minimum magnitude to flow through the load only when the ground potential M1 exceeds the ground potential M2 by a threshold level, a measuring element for detecting the magnitude of the test current, and an evaluation circuit responsive to the magnitude of the test current detected by the measuring element for initiating countermeasures to protect the control apparatus from damage resulting from differences in the ground potentials M1 and M2.

The invention is also directed to electronic control equipment for motor vehicles, particularly electronic control brake equipment, with at least one terminal for supply voltage, at least one ground terminal M1, and at least on output terminal for driving a load lying at ground M2 on one side. The equipment has a circuit arrangement that causes a test current to flow at a preset minimum magnitude through the load only if the ground potential M1 of the control equipment is larger by a preset value than the ground potential M2 of the load and by a measuring element that detects the magnitude of this test current and feeds it to an evaluation circuit which takes countermeasures to protect against damage to components of the control equipment.

Finally, the invention is directed to a method for protecting an electronic control apparatus that controls an electrical load for use in motor vehicles, the control apparatus having at least one supply voltage terminal for providing a supply voltage to the control apparatus, at least one ground terminal for grounding the control apparatus at a ground potential M1, and at least one output terminal for driving the load with the supply voltage, the load having a first connection to the output terminal and a second connection grounded to a ground potential M2. The method involves causing a test current having a predetermined minimum magnitude to flow through the load only when the ground potential M1 exceeds the ground potential M2 by a threshold level, detecting the magnitude of the test current, determining a difference in the ground potentials M1 and M2 in response to the detected magnitude of the test current, and initiating countermeasures to protect the control apparatus from damage resulting from the difference in the ground potentials M1 and M2.

Other objects and features will be in part apparent and in part pointed out hereinafter.

BRIEF DESCRIPTION OF THE DRAWINGS

The invention is described in greater detail below in conjunction with the drawings.

FIG. 3 is a schematic circuit diagram of control equipment according to yet another embodiment of the invention.

Identical reference numerals in the individual figures identify similar or corresponding components.

DETAILED DESCRIPTION OF THE INVENTION

Figure 1:
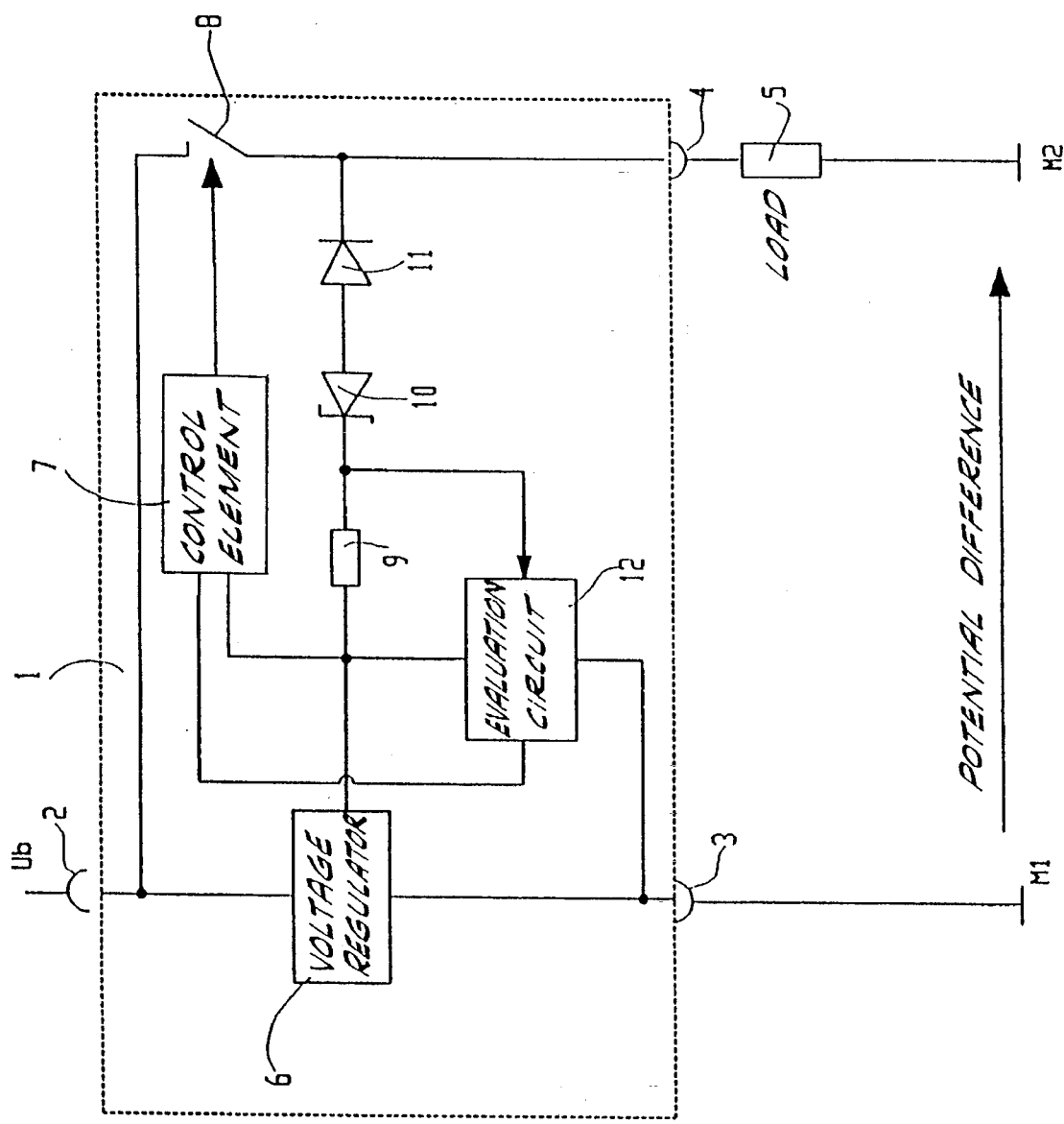
FIG. 1 is a schematic circuit diagram of control equipment according to a preferred embodiment of the invention.

An electronic control device 1 for motor vehicles has three different terminals, namely a first terminal 2 for connection to positive supply voltage Ub, a terminal 3 for connection to an equipment ground M1 and a third terminal 4 for connection to a load 5. The load 5 is in turn connected to a ground potential M2, referred to below as load ground. Because of undesirable contact resistance, it may occur that a potential difference appears between the grounds M1 and M2. The control device 1 normally contains a voltage regulator 6 and a control element 7, which may, for instance, be an antilocking control, an electronic brake control or the like. The control element 7 is supplied with regulated supply voltage by the voltage regulator 6. The output of control element 7 controls a power switch 8 which connects load 5 to supply voltage Ub.

In contrast to conventional systems, control device 1 advantageously causes a test current to flow through load 5 in response to a ground potential difference, measures the magnitude of the test current and initiates countermeasures to protect control device 1 and, particularly, control element 7 and power switch 8, from damage resulting from differences in the ground potentials. Further, control device 1 produces the test current only when a difference in the ground potentials M1 and M2 occurs. This is particularly beneficial because in monitoring an electronic circuit, the monitoring circuitry must generally be active in order to detect an error. In the present invention, however, the monitoring circuitry is inactive as long as an error does not occur. In contrast to prior art systems, the error itself activates the monitoring feature of the present invention. This is a principle which is completely new over the prior art.

Now, in the embodiment of FIG. 1, according to the invention, a test current is sent by voltage regulator 6 via a series circuit comprised of a resistor 9, a Zener diode 10 and a diode 11 by way of the terminal 4 and load 5 to load ground M2. The voltage drop occurring at the resistor 9 due to this test current is measured by an evaluation circuit 12 and compared to preset threshold values. The evaluation circuit 12 may, for instance, have a comparator which compares the voltage drop measured at resistor 9 to one or more reference values.

The test current and, thus, the magnitude of the potential drop at resistor 9 are dependent on the potential difference between the two ground potentials M1 and M2. In case of large potential difference in the direction of the arrow, the voltage drop at resistor 9 is correspondingly large, so that when a preset threshold value is reached, evaluation circuit 12 can initiate countermeasures, consisting here in opening the power switch 8 to cut off load 5. Thus, the sensitive power switch 8 is protected against damage resulting from an excessive load current. Power switch 8 is in many cases an integrated component of control element 7, so that control element 7 is also protected from damage.

The Zener diode 10 is preferably chosen with its breakdown voltage such that it becomes conductive only after a preset potential difference occurs. Thus, the test current flows only after reaching this potential difference. The diode 11, connected in its conductive direction with respect to the direction from voltage regulator 6 to load 5, prevents evaluation circuit 12 from being subjected to the supply voltage Ub in the case of a closed power switch 8.

Figure 2:
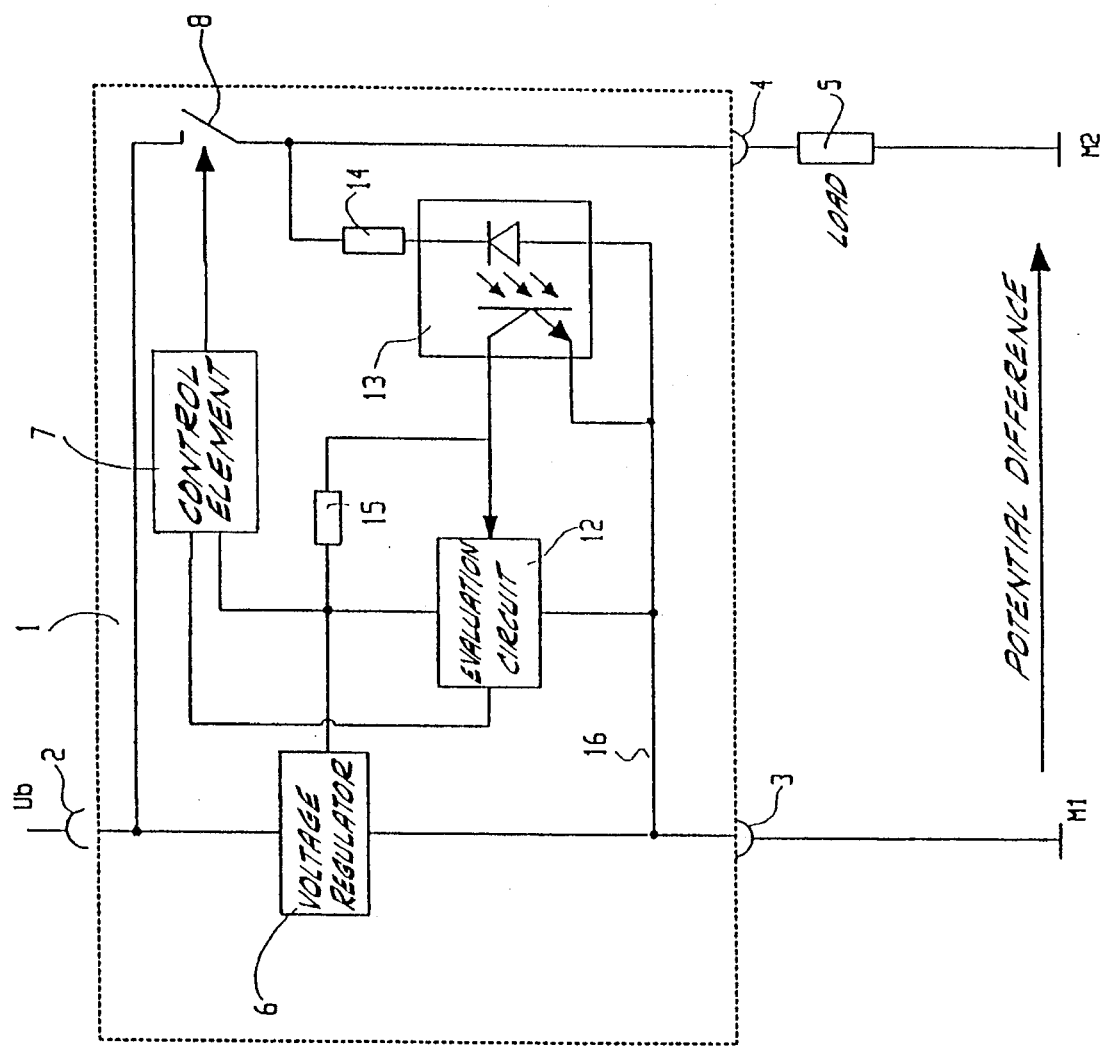
FIG. 2 is a schematic circuit diagram of control equipment according to another embodiment of the invention.

The embodiment of FIG. 2 differs in the construction of the circuit for the test current, whereas control device 1 is constructed identically. The ground connection of control device 1 which carries ground potential M1 is connected via an optocoupler 13 to the output of control device 1 and hence to terminal 4 of load 5. There is also a resistor 14 in this branch. If potential M1 is larger than potential M2, then a current flows from equipment ground M1 via the terminal 3, a line 16 through the light-emitting diode of the optocoupler 13, the resistor 14, terminal 4 and load 5 to load ground M2. If this current exceeds the preset threshold value, then the transistor of optocoupler 13 becomes conductive and connects a resistor 15 via the line 16 and terminal 3 to ground potential M1. The other terminal of the resistor 15 is connected to an output of voltage regulator 6. Then an electric current flows through resistor 15 and produces a voltage drop there, which can in turn be detected by evaluation circuit 12. Evaluation circuit 12 can then directly open switch 8, or supply a corresponding signal to control element 7 which causes control element 7 to open switch 8. In this embodiment of FIG. 2, the test current flows from equipment ground M1 to load ground M2 and not, as in FIG. 1, from voltage regulator 6 to load ground M2.

The embodiment of FIG. 3 corresponds essentially to that of FIG. 1 and is differentiated from the latter only in that Zener diode 10 of FIG. 1 is replaced by a resistor 17. The resistors 9 and 17 cooperate with load to make a voltage divider, with the voltage drop being detected here, as in the embodiment of FIG. 1, at resistor 9. The test current flows in this embodiment even with a small potential difference between M1 and M2, as soon as the very slight response voltage of diode 11 is exceeded, whereas in the embodiment of FIG. 1 it flows only if the potential difference between M1 and M2 has exceeded the Zener potential of Zener diode 10.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

What is claimed is:

1. An electronic control apparatus that controls an electrical load for use in motor vehicles comprising:

at least one supply voltage terminal for providing a supply voltage to the control apparatus;

at least one ground terminal for grounding the control apparatus at a ground potential M1;

at least one output terminal for driving the load with the supply voltage, said load having a first connection to the output terminal and a second connection grounded to a ground potential M2;

a test circuit for causing a test current having a predetermined minimum magnitude to flow through the load only when the ground potential M1 exceeds the ground potential M2 by a threshold level;

a measuring element for detecting the magnitude of the test current; and an evaluation circuit responsive to the magnitude of the test current detected by the measuring element for initiating countermeasures to protect said control apparatus from damage resulting from differences in the ground potentials M1 and M2.

2. The apparatus according to claim 1 further comprising a power switch responsive to the evaluation circuit for selectively disconnecting the load from the supply voltage.

3. The apparatus according to claim 1 wherein the evaluation circuit receives and is responsive to the magnitude of the test circuit for determining a potential difference between the ground potentials M1 and M2.

4. The apparatus according to claim 3 wherein the measuring element is a resistor which is part of the test circuit and wherein the magnitude of the test current is detected by measuring the voltage drop across the resistor.

5. The apparatus according to claim 1 wherein the test circuit includes a voltage regulator for providing the test current.

6. The apparatus according to claim 5 wherein the test circuit includes a resistor and a Zener diode connected in series and causes the test current to flow from the voltage regulator via the resistor and the Zener diode through the load to the ground potential M2.

7. The apparatus according to claim 6 wherein the test circuit includes a diode connected in series with the resistor and the Zener diode in the direction of the test current from the voltage regulator to the load.

8. The apparatus according to claim 5 wherein the test circuit includes a first resistor, a second resistor and a diode connected in series and causes the test current to flow from the voltage regulator via the first resistor, the second resistor and the diode through the load to the ground potential M2 and wherein the diode is connected in direction of the test current from the voltage regulator to the load.

9. The apparatus according to claim 5 wherein the test circuit includes an optocoupler having a transmitter diode and causes the test current to flow from the ground potential M1 via the transmitter diode through the load to the ground potential M2.

10. The apparatus according to claim 9 wherein the measuring element is a resistor which is part of the test circuit and wherein the optocoupler has a switching transistor responsive to the transmitting diode, wherein the switching transistor has a first terminal connected to the voltage regulator via the resistor and to the evaluation circuit and has a second terminal connected to the ground potential M1, and wherein the evaluation circuit is responsive to the test current in the transmitter diode causing conduction in the switching transistor for determining a potential difference between the ground potentials M1 and M2.

11. Electronic control equipment for motor vehicles, particularly electronic control brake equipment, with at least one terminal for supply voltage, at least one ground terminal M1 and at least on output terminal for driving a load lying at ground M2 on one side, comprising: a circuit arrangement that causes a test current to flow at a preset minimum magnitude through the load only if the ground potential M1 of the control equipment is larger by a preset value than the ground potential M2 of the load and by a measuring element that detects the magnitude of this test current and feeds it to an evaluation circuit which takes countermeasures to protect against damage to components of the control equipment.

12. A method four protecting an electronic control apparatus that controls an electrical load for use in motor vehicles, said control apparatus having at least one supply voltage terminal for providing a supply voltage to the control apparatus, at least one ground terminal for grounding the control apparatus at a ground potential M1, and at least one output terminal for driving the load with the supply voltage, said load having a first connection to the output terminal and a second connection grounded to a ground potential M2, said method comprising the steps of:

causing a test current having a predetermined minimum magnitude to flow through the load only when the ground potential M1 exceeds the ground potential M2 by a threshold level;

detecting the magnitude of the test current;

determining a difference in the ground potentials M1 and M2 in response to the detected magnitude of the test current; and initiating countermeasures to protect the control apparatus from damage resulting from the difference in the ground potentials M1 and M2.

* * * * *